United States Patent [19]

Gomi

[11] 4,128,817

[45] Dec. 5, 1978

[54] VOLTAGE CONTROLLED OSCILLATOR WITH PHASE CONTROL CIRCUITS

[75] Inventor: Hiroshi Gomi, Fukaya, Japan

[73] Assignee: Tokyo Shibaura Electric Co., Ltd., Kawasaki, Japan

[21] Appl. No.: 773,689

[22] Filed: Mar. 2, 1977

[30] Foreign Application Priority Data

Mar. 3, 1976 [JP] Japan .................................. 51-22270
Mar. 9, 1976 [JP] Japan .................................. 51-24646
Mar. 9, 1976 [JP] Japan .................................. 51-24647
Mar. 10, 1976 [JP] Japan .................................. 51-24998

[51] Int. Cl.$^2$ .......................... H03B 3/04; H04N 9/46
[52] U.S. Cl. ................................ 331/177 R; 329/122; 331/8; 331/34; 331/116 R; 358/28
[58] Field of Search ............. 331/8, 34, 116 R, 177 R; 329/122, 124, 125; 358/25, 28, 17, 19

[56] References Cited

U.S. PATENT DOCUMENTS

| | | | |
|---|---|---|---|
| 3,691,475 | 9/1972 | Mouri et al. | 331/34 X |
| 3,743,764 | 7/1973 | Wittmann | 358/28 |
| 3,780,219 | 12/1973 | O'Toole | 358/25 X |
| 3,806,634 | 4/1974 | Abbott et al. | 331/177 R X |
| 3,973,221 | 8/1976 | Jett, Jr. | 331/116 R |
| 4,020,500 | 4/1977 | Harwood | 331/8 X |

Primary Examiner—Siegfried H. Grimm
Attorney, Agent, or Firm—Cushman, Darby & Cushman

[57] ABSTRACT

A tank circuit including a quartz vibrator and a phase shifter connected to the tank circuit for forming a vector signal $\dot{e}_1$ from the tank circuit and a vector signal $\dot{e}_2$ delayed a predetermined angle from the signal $\dot{e}_1$. A differential circuit is used to subtract $\dot{e}_1$ from $\dot{e}_2$ thus forming a difference signal $\dot{e}_3$. The delayed signal $\dot{e}_2$ is inverted by a phase inverting circuit to obtain two signals $\dot{e}_2$ and $-\dot{e}_2$ which are applied to an addition circuit where their relative amplitude ratio is controlled. The addition cicuit adds signal $\dot{e}_3$ to the signals $\dot{e}_2$ and $\dot{e}_3$ whose relative amplitude ratio has been controlled for producing a sum signal which is fed back to the tank circuit.

11 Claims, 16 Drawing Figures

VOLTAGE CONTROLLED OSCILLATOR WITH PHASE CONTROL CIRCUITS

BACKGROUND OF THE INVENTION

In recent years, the circuit of a color television receiving set has been divided into a plurality of sections according to the functions thereof and to form respective sections as independent integrated circuit units. More particularly, nearly all of the circuit sections starting from an image intermediate frequency amplifier circuit to a color demodulation circuit are formed as integrated circuit units and only such circuits as portions of the output stage which require a high power are constructed by transistor circuits. In such a transistorized circuit, however, since the existing circuit is sectionalized and each section is transistorized, the number of the integrated circuit units increases as the number of the circuit units increase. Accordingly, efforts have been made to form integrated circuit units capable of providing the functions of a plurality of circuit sections for the purpose of decreasing the number of the integrated circuit units. For example, it has been tried to combine three integrated circuit units for the band amplifier, color demodulation circuit and color synchronizing circuit respectively of a color television receiving set into a single integrated circuit using having multiple functions, thereby increasing the efficiency of integration. In such multifunction integrated circuit unit, however, it is necessary to provide pins for connecting it with external circuits of the number equal to the number of the pins of three independent integrated circuit units thus increasing the size of the multifunction integrated circuit unit. Of course it is desirable to decrease as far as possible the number of such pins. It is also necessary to incorporate into such multi-function integrated circuit unit a voltage controlled type oscillation circuit, a phase control circuit and a phase shifting circuit for use in a demodulation circuit. However, at present, as it is difficult to incorporate the phase shifting circuit into the integrated circuit unit, it is obliged to construct the phase shifting circuit as an element outside of the integrated circuit unit. Accordingly, it is necessary to provide a large number of pins for the integrated circuit unit for connecting it with external or peripheral circuit elements thus increasing the size of the integrated circuit unit.

Although a multi-function integrated circuit unit is advantageous in that it can decrease the number of independent integrated circuits it is also desirable to provide multifunction unit circuits for the integrated circuit unit for the purpose of providing a more efficient multi-function integrated circuit unit.

SUMMARY OF THE INVENTION

It is an object of this invention to provide an improved voltage controlled oscillator (VCO) with a phase control circuit suitable for use in a color signal system of a color television receiving set and having a decreased number of pins and suitable for fabricating a multi-function integrated circuit.

Another object of this invention is to provide a phase control circuit capable of efficiently controlling the phase difference between two signals generated by a control signal.

Still another object of this invention is to provide a voltage controlled type phase shifting circuit.

According to one aspect of this invention there is provided a VCO with phase control circuit comprising means for generating a reference oscillation signal, first and second phase shifter means supplied with the reference oscillation signal for forming first and second signals having different phases, a third phase shifter means supplied with the first signal from the first phase shifter means for forming third and fourth signals having different phases, an addition circuit for vectorially adding the third and fourth signals formed by the third phase shifter means thus forming a sum signal and for vectorially adding the sum signal to the second signal, and a feedback circuit for feeding back the output signal from the addition circuit to the means for generating the reference oscillation signal.

According to another aspect of this invention, there is provided a voltage controlled type oscillator comprising a reference oscillation signal generator, a first phase shifter for shifting the phase of a signal derived out from one terminal of the reference oscillation signal generator by a predetermined angle, a second phase shifter for inverting the output vector of the first phase shifter, an addition circuit for controlling the ratio of the absolute values of the output vectors of the first and second phase shifters to a predetermined ratio and then vectorially adding the output vectors, said addition circuit having an output terminal connected to the other terminal of the reference oscillation signal generator, a third phase shifter connected across the reference oscillation signal generator for shifting the output thereof a predetermined angle, and means for feeding back a resultant vector of the output of the third phase shifter and the output of the addition circuit to the other end of the reference oscillation signal generator for controlling the signal generated thereby.

DESCRIPTION OF THE PREFERRED EMBODIMENTS

Figure 1:
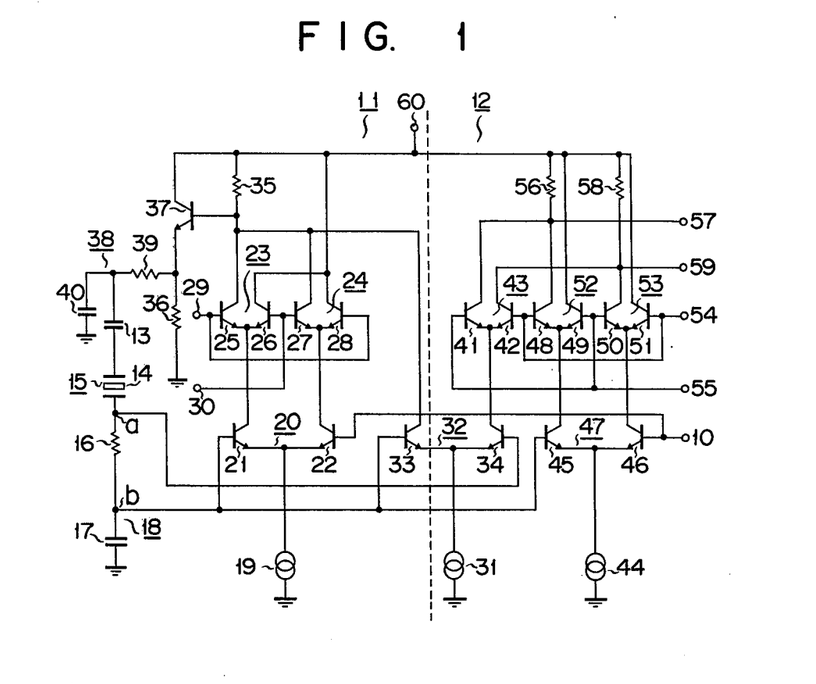
FIG. 1 is a connection diagram showing one embodiment of the VCO with phase control circuit embodying the invention.
Figure 2:
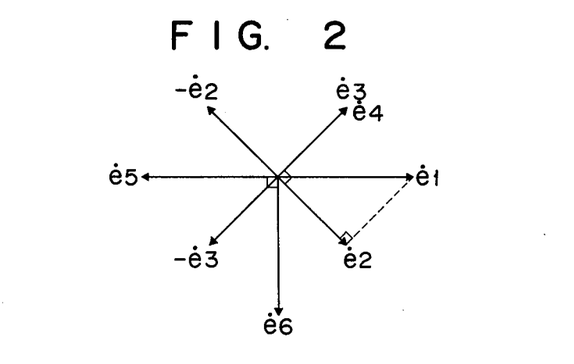
FIG. 2 is a vector diagram for explaining the operation of the phase shifting circuit shown in FIG. 1.

FIG. 1 shows a VCO with phase control circuit comprising a voltage controlled type oscillator 11 for producing a reference subcarrier wave, and a DC color phase control circuit for supplying to a demodulation circuit a reference subcarrier wave that determines a color demodulation axis. The voltage controlled type oscillator 11 comprises a tank circuit 15 made up of a capacitor 13 and a quartz vibrator 14, and the tank circuit 15 is connected to a phase shifting circuit 18 including a resistor 16 and a capacitor 17. Accordingly, at the junction a between the tank circuit 15 and the phase shifting circuit 18 appears a reference signal $\dot{e}_1$ ($\dot{e}_1$ is a vector signal. For the purpose of description, the amplitude relationship of the vector signals is expressed by ignoring the gain of the amplifier circuit). Signal $\dot{e}_2$ is derived out from the junction b between the resistor 16 and the capacitor 17, and lags signal $\dot{e}_1$ by 45°, for example, as shown in FIG. 2. Signal $\dot{e}_2$ is applied to the base electrode of a transistor 21 having an emitter electrode connected to a constant current source 19 together with the emitter electrode of a transistor 22 thus forming a first differential amplifier 20. The base electrode of transistor 22 is supplied with a predetermined bias potential from a bias terminal 10. Accordingly, a signal $-\dot{e}_2$ corresponding to the inverted signal of $\dot{e}_2$ appears on the collector electrode of transistor 21 whereas a signal having the same phase as signal $\dot{e}_2$ appears on the collector electrode of the other transistor 22. These signals $-\dot{e}_2$ and $\dot{e}_2$ are supplied to the second and third differential amplifiers 23 and 24 respectively each constructed as a doubly balanced type. The differential amplifiers 23 and 24 respectively comprise pairs of transistors 25 and 26, and 27 and 28 with their emitter electrodes commonly connected. Signals $-\dot{e}_2$ and $\dot{e}_2$ are applied to the respective junctions of the commonly connected emitter electrodes. The base electrodes of the transistors 25 through 28 comprising the differential amplifiers 23 and 24 are applied with control signals supplied to input terminals 29 and 30 from a phase detection circuit, not shown, whereby the relative amplitude ratio of signals $-\dot{e}_2$ and $\dot{e}_2$ is controlled by the control signals and then the signals $-\dot{e}_2$ and $\dot{e}_2$ are added to each other. The results of additions are derived out from the collector electrodes respectively of transistors 25 and 27. These two outputs are expressed as follows.

$$e_a = p\dot{e}_x + (1 - p)\dot{e}_y \quad (1)$$

$$e_b = +(1 - p)\dot{e}_x + p\dot{e}_y \quad (2)$$

where p is a variable coefficient expressed by $0 \leq p \leq 1$ and $\dot{e}_x$ and $\dot{e}_y$ represent signals to be added to each other, $\dot{e}_x$ corresponds to $\dot{e}_2$ and $\dot{e}_y$ to $-\dot{e}_2$, or $\dot{e}_x$ corresponds to $-\dot{e}_2$ and $\dot{e}_y$ to $+\dot{e}_2$, and $|\dot{e}_x| = |\dot{e}_y|$.

Signal $\dot{e}_2$ from the junction b is applied to the base electrode of transistor 33 with its emitter electrode connected to a constant current source 31 together with the emitter electrode of transistor 34 thus constituting a fourth differential amplifier 32. The base electrode of transistor 34 is connected to receive signal $\dot{e}_1$ at the junction a. The differential amplifier 32 produces the difference between signals $\dot{e}_1$ and $\dot{e}_2$ to obtain signals $\dot{e}_3$ and $-\dot{e}_3$ shown in FIG. 2 on the respective collector electrodes of transistors 33 and 34. Signal $\dot{e}_3$ is added to the outputs from the differential amplifiers 23 and 24 to form a signal $\dot{e}_4$ as shown in FIG. 2. For example, in equations 1 and 2, if we put $p = \frac{1}{2}$, then signal $\dot{e}_4$ will have the same phase as signal $\dot{e}_3$. The phase of signal $\dot{e}_4$ varies in a range of 90° about $\dot{e}_2$ depending upon the magnitude of the control signal, and the precise phase is determined by the magnitude of the control signal. Signal $\dot{e}_4$ is derived by a collector resistor 35 of transistor 25 and then applied to a phase shifter 38 through an emitter follower transistor 37 having an emitter electrode grounded through a resistor 36. The phase shifter 38 may be constituted by a resistor 39 and a capacitor 40 for example and constructed to form a voltage vector coinciding with the input vector of the tank circuit 15. In other words, the emitter follower transistor 37, the phase shifter 38 and the tank circuit 15 constitute a positive feedback circuit for the voltage controlled type oscillator 11.

A hue adjusting circuit 12 comprises a fifth differential amplifier 43 made up of a pair of transistors 41 and 42 having commonly connected emitter electrodes. The signal $-\dot{e}_3$ appearing on the collector electrode of the transistor 34 of the fourth differential amplifier 32 is applied to the commonly connected emitter electrodes of the transistors 41 and 42. The hue adjusting circuit 12 further comprises a sixth differential amplifier 47 made up of a pair of transistors 45 and 46. The signal $\dot{e}_2$ appearing at the junction b is applied to the base electrode of transistor 45. The commonly connected emitter electrodes of the transistors 45 and 46 are connected to a constant current source 44. The base electrode of the transistor 46 is supplied with a predetermined bias voltage from a bias terminal 10. As a consequence, a signal $-\dot{e}_2$ corresponding to the inversion of signal $\dot{e}_2$ appears on the collector electrode of transistor 45. On the other hand, signal $\dot{e}_2$ having the same phase as above described signal $\dot{e}_2$ appears on the collector electrode of the other transistor 46. These signals are applied to the commonly connected emitter electrodes respectively of transistors 48 and 49, and 50 and 51 that constitute seventh and eighth differential amplifiers 52 and 53, respectively. The seventh differential amplifier 52 and the fifth differential amplifier 43 are connected as a doubly balanced type as are the fifth and eighth differential amplifiers 43 and 53. The base electrodes of transistors 41, 42, 48 through 51 of the differential amplifiers 43, 52 and 53 are supplied with control voltages from DC control terminals 54 and 55 for adjusting the relative amplitude ratio of the signals. Considering a combination of the fifth differential amplifier 43 and the seventh differential amplifier 52, the relative amplitude ratio of signals $-\dot{e}_3$ and $-\dot{e}_2$ is adjusted by the control voltages and then signals $-\dot{e}_3$ and $-\dot{e}_2$ are added together for producing signal $\dot{e}_5$ shown in FIG. 2 by the collector resistor 56, the signal $\dot{e}_5$ being derived out from terminal 57. In the case of the combination of the fifth and eighth differential amplifiers 43 and 53, the relative amplitude ratio of the signals $-\dot{e}_3$ and $\dot{e}_2$ is controlled by the control voltages and thereafter the signals $-\dot{e}_3$ and $\dot{e}_2$ are added to each other for producing a signal $\dot{e}_6$ shown in FIG. 2 which is taken out from terminal 59 connected to a collector resistor 58. The signals $\dot{e}_5$ and $\dot{e}_6$ appearing on the output terminals 57 and 59 are applied to a demodulation circuit, not shown. Signals $\dot{e}_5$ and $\dot{e}_6$ have a phase difference of 90° which is maintained constant irrespective of the control voltages. Consequently, signals $\dot{e}_5$ and $\dot{e}_6$ are suitable for use as the demodulation axes for hue signals R-Y and B-Y. The circuit shown in FIG. 1 is supplied with an operating voltage from a source terminal 60.

The signal produced by the voltage controlled type oscillator 11 described above can be applied directly to the DC hue adjusting circuit 12 and the output thereof can be applied directly to the demodulation circuit for setting the demodulation axes thereof. Since substantially all portions of these circuits can be made of semiconductor circuits they can be fabricated as integrated circuits. Moreover, as external circuits are greatly simplified (comprising only the tank circuit and the phase shifter) it is possible to form an integrated circuit having a small number of pins.

It should be understood that the invention is not limited to the specific embodiment described above.

Figure 3:
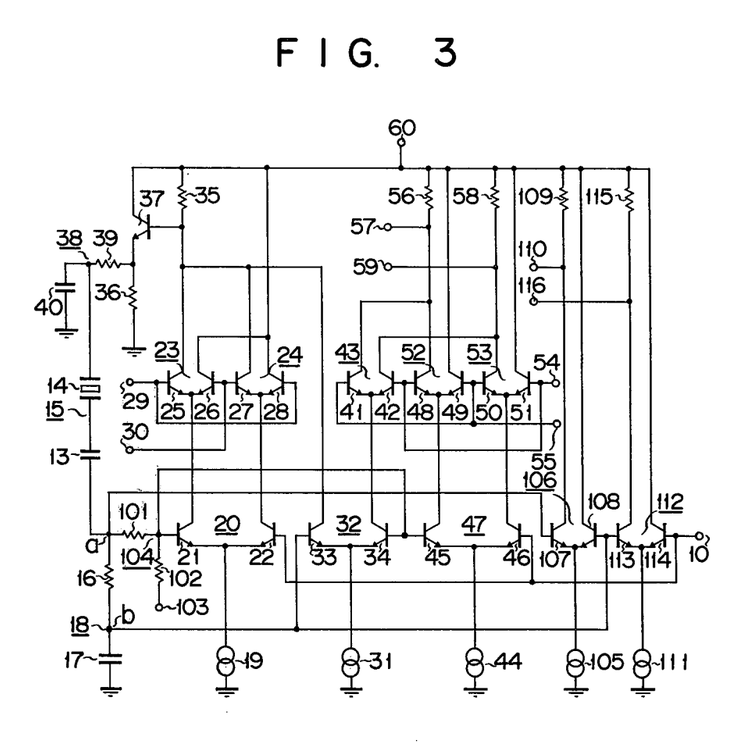
FIG. 3 is a connection diagram showing a modification of this invention.

FIG. 3 shows a modification of this invention wherein elements corresponding to those shown in FIG. 1 are designated by the same reference numerals. The modification shown in FIG. 3 is different from the embodiment shown in FIG. 1 in that there are added a circuit for switching the output from the voltage controlled type oscillator 11 between a phase detection circuit (not shown) of an automatic phase control circuit APC and a color killer detection circuit, not shown, and a voltage dividing circuit is connected between the tank circuit and the first differential amplifier. More particularly, a resistor 101 is connected across the junction a between the tank circuit 15 and the phase shifter 18 and the base electrode of the transistor 21, and a predetermined bias voltage is applied to the base electrode of transistor 21 from a bias terminal 103 via a resistor 102. The signals applied to the respective base electrodes of the other transistors 21, 34 and 45 are the same as those used in the embodiment shown in FIG. 1.

Figure 4:
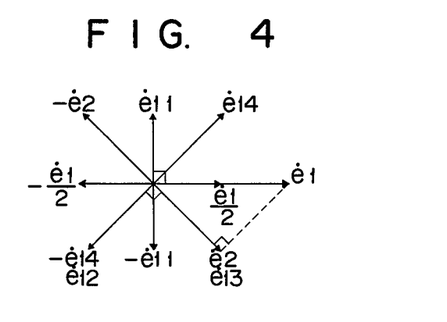
FIG. 4 is a vector diagram useful to explain the operation of the VCO with phase control circuit shown in FIG. 3.

More particularly, resistor 101 constitutes a voltage dividing circuit 104 together with resistor 102. Where the resistance values of resistors 101 and 102 are made equal the signal produced at the point of voltage division is shown by $\dot{e}_1/2$ as shown in FIG. 4. The signal $\dot{e}_1/2$ causes a signal $-\dot{e}_1/2$ to be generated at the collector electrode of transistor 21 and a signal $\dot{e}_1/2$ at the collector electrode of transistor 22. Thus, these two signals $\dot{e}_1/2$ and $-\dot{e}_1/2$ are applied to the second and third differential amplifiers 23 and 24 respectively and are added to each other after the relative amplitude ratio has been adjusted in the same manner as in the embodiment shown in FIG. 1. The sum signal is added to the output from transistor 33 of the fourth differential amplifier 32 which calculates the difference between signals $\dot{e}_2$ and $\dot{e}_1/2$ thus producing a signal $\dot{e}_{11}$ shown in FIG. 4 on the collector electrode of transistor 33. Signal $\dot{e}_{11}$ is added to the outputs from the second and third differential amplifiers 23 and 24. As can be noted from equations 1 and 2, since the value of P is selected to satisfy a relation $0 \leq P \leq 1$, the result of addition varies in a range of $\pm 45°$ about signal $\dot{e}_{11}$. As a consequence, the signal $\dot{e}_{11}$ is controlled within this range by the control voltages from terminals 29 and 30. Where the control voltage is set to be $\frac{1}{2}P$, an output signal having the same phase as signal $\dot{e}_{11}$ will be produced. Thus, the output signal has a phase difference 90° with respect to signal $\dot{e}_1$. The sum signal $e_{11}$ passes through transistor 37 and phase shifter 38 and then is positively fed back to the oscillator via the tank circuit 15. Thus, signal $-\dot{e}_{11}$ is produced on the collector electrode of transistor 34 of the fourth differential amplifier 32, and the signal $-\dot{e}_{11}$ is applied to the fifth differential amplifier 43. Signal $\dot{e}_1/2$ is supplied to the base electrode of the transistor 45 of the sixth differential amplifier 47 for producing signals $-\dot{e}_1/2$ and $\dot{e}_1/2$ respectively on the collector electrodes of transistors 45 and 46. Signals $-\dot{e}_1/2$ and $-\dot{e}_{11}$ are added each other by the fifth and seventh differential amplifiers 43 and 52 to obtain a signal $\dot{e}_{12}$ whereas signals $\dot{e}_1/2$ and $-\dot{e}_{11}$ are added to each other by the fifth and eighth differential amplifiers 43 and 53 to obtain signal $\dot{e}_{13}$. Signals $\dot{e}_{12}$ and $\dot{e}_{13}$ have a phase difference of 90°. This phase difference is maintained constant regardless of the magnitudes of the control voltages from DC control terminals 54 and 55 so that it is possible to use signals $\dot{e}_{12}$ and $\dot{e}_{13}$ as the demodulation axes for R-Y and B-Y. Signals $\dot{e}_1$ and $\dot{e}_2$ are applied respectively to the base electrodes of transistors 107 and 108 with commonly connected emitter electrodes connected to a constant current source 105 thus forming a ninth differential amplifier 106, in which signals $\dot{e}_1$ and $\dot{e}_2$ are subtracted each other thus forming a signal $\dot{e}_{14}$ or $-\dot{e}_{14}$. In the circuit shown in FIG. 3, signal $-\dot{e}_{14}$ is obtained from the collector resistor 109 of the transistor 107 through an output terminal 110 and then applied to a product phase detection circuit, not shown. Signal $\dot{e}_2$ is also supplied to the base electrode of transistor 113 constituting a tenth differential amplifier 112 and the base electrode of the other transistor 114 is supplied with a predetermined bias signal from the bias terminal 10. The emitter electrodes of transistors 113 and 114 are commonly connected to a constant current source 111. As a consequence, a signal $-\dot{e}_2$, that is an inversion of signal $\dot{e}_2$, appears on the collector resistor 115 and is supplied at output terminal 116 and applied to the color killer detection circuits.

Suppose now that signal $\dot{e}_{12}$ appearing on terminal 57 sets the R-Y demodulation axis and signal $\dot{e}_{13}$ appearing on terminal 59 the B-Y demodulation axis, the burst signal will be advanced by 90° than the R-Y demodulation axis so that it will have the same axis as signal $\dot{e}_2$ ($\dot{e}_{13}$).

With regard to the color killer detection circuit, where it is constructed by an integrated circuit its circuit construction generally has a form of synchronous detector so that it has a phase relationship that produces a maximum output when shifted by 90° with reference to the subcarrier wave supplied to the detection circuit. Accordingly, an output is produced from terminal 116 for application to the color killer detection circuit when signal $\dot{e}_2$ or phase inverted signal $-\dot{e}_2$ is at the same or opposite phase with respect to the burst signal. As a consequence it is possible to use the signal $-\dot{e}_2$ derived out from output terminal 116 for color killer detection circuit. On the other hand, signal $-\dot{e}_{14}$ derived out from signal 110 has a phase difference of 90° with respect to the burst signal. Since a synchronous detection circuit is generally used for an automatic phase control circuit, where signal $-\dot{e}_{14}$ has a phase difference of 90°, the output from the detection circuit becomes zero. When the output becomes zero the oscillation is stabilized. Of course, as the phase departs from 90°, an output is produced to correct the oscillation frequency.

With the embodiments shown in FIGS. 1 and 3, it is possible to directly apply to the demodulation circuit the two output signals produced by a hue adjusting circuit by utilizing a phase shifter utilized in a voltage controlled type oscillator, or to decrease the number of the phase shifters by coupling directly the two output signals to the demodulation circuit thereby affording a plurality of functions to the phase shifter. For this reason, it is possible to incorporate into an integrated circuit not only the voltage controlled type oscillator and the hue adjusting circuit but also the demodulation circuit thus greatly decreasing the number of pins for external connections. This not only simplifies the fabrication of the integrated circuit but also reduces it size.

Figure 5:
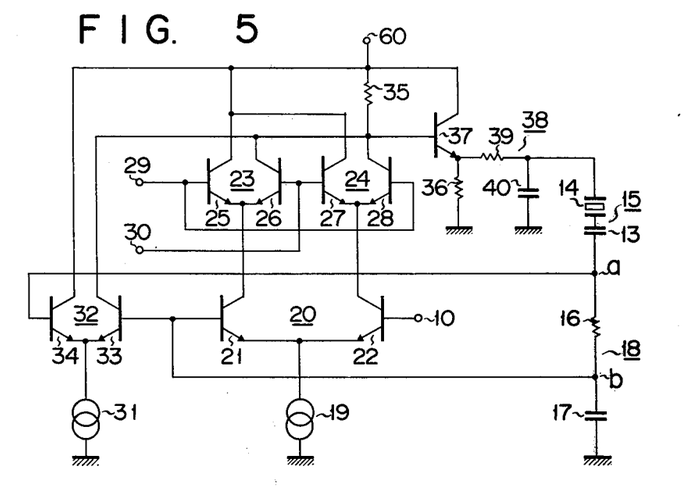
FIG. 5 is a connection diagram showing a voltage controlled type phase shifting circuit comprising the phase control circuit.

FIG. 5 is a connection diagram of a modified voltage controlled type oscillator utilized to design the phase control circuit described above.

Assume now that a voltage vector $\dot{E}_1$ at one end of a resistor 16 shown in FIG. 5 comprises a reference vector, and that the voltage vector at the other end of resistor 16 whose phase has been shifted by a predetermined angle by phase shifter 18 is represented by vector $\dot{E}_2$. Vector $\dot{E}_1$ is impressed upon the base electrode of transistor 34 while vector $\dot{E}_2$ is impressed upon the common junction between the base electrodes of transistors 21 and 23. In other words, vectors $\dot{E}_2$ and $\dot{E}_1$ are impressed upon transistors 33 and 34 respectively which constitute the differential amplifier 32. Accordingly, a vector $(\dot{E}_1-\dot{E}_2)$ appears on the collector electrode of transistor 33 by the differential amplifying action while a vector $-(\dot{E}_1-\dot{E}_2)$ appears on the collector electrode of transistor 34.

The vector $\dot{E}_2$ applied to the base electrode of transistor 21 of the differential amplifier 20 creates a vector $-\dot{E}_2$ which is an inversion of vector $\dot{E}_2$ on the collector electrode of transistor 21 by the differential amplifying action of the differential amplifier 20. In the same manner, vector $\dot{E}_2$ is formed on the collector electrode of transistor 22. These vectors $-\dot{E}_2$ and $\dot{E}_2$ are applied to differential amplifiers 23 and 24 respectively which are connected to form a doubly balanced type differential amplifier whereby these vectors are added vectorially after the relative ratio of their absolute values has been adjusted to a predetermined ratio in accordance with the control voltages impressed upon terminals 29 and 30. An output vector $(\dot{E}_1-\dot{E}_2)$ produced by transistor 33 is added to the resultant or sum vector thus producing a vector $\dot{E}_3$ across resistor 35.

The resultant vector $\dot{E}_3$ is applied to phase shifter 38 and tank circuit 15 via transistor 37 whereby the phase of the vector $\dot{E}_3$ is lagged. If there is a phase difference between the delayed vectors $\dot{E}_3$ and $\dot{E}_1$, the oscillation frequency of the quartz oscillator 14 is corrected to eliminate such phase difference.

In this manner, in the modification shown in FIG. 5, the vectors which are added to each other after the ratio of their absolute values has been adjusted to a predetermined ratio are the vector $-\dot{E}_2$ appearing on the collector electrode of transistor 21 and vector $\dot{E}_2$ produced on the collector electrode of transistor 22 by the differential amplifying action of the differential amplifier 20 and having the same absolute value as vector $-\dot{E}_2$. The advantage of producing vectors $-\dot{E}_2$ and $\dot{E}_2$ having the same absolute value on the collector electrodes of transistors 21 and 22 that constitute the differential amplifier 20 will now be described with reference to the vector diagram shown in FIG. 6.

Figures 6, 8:
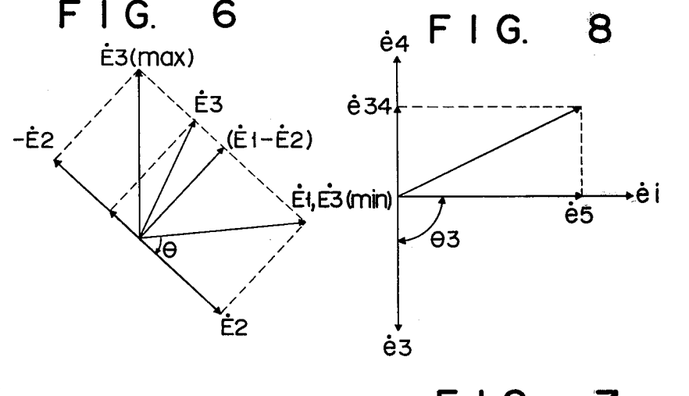
FIG. 6 is a vector diagram useful to explain the phase shifting operation of the phase shifting circuit.
FIG. 8 is a block diagram useful to explain the operation of the circuit shown in FIG. 7.

The differential amplifier 32 is supplied with a reference vector $\dot{E}_1$ and a vector $\dot{E}_2$ which is phase shifted from vector $\dot{E}_1$ by a predetermined angle, and transistor 33 forms a vector $(\dot{E}_1-\dot{E}_2)$ corresponding to an inversion of the difference vector between vectors $\dot{E}_1$ and $\dot{E}_2$. The phase difference between vectors $\dot{E}_2$ and $(\dot{E}_1-\dot{E}_2)$ is 90°. As vector $\dot{E}_2$ is impressed upon the base electrode of transistor 21 an inverted vector $-\dot{E}_2$ appears on the collector electrode. Further a vector $\dot{E}_2$ is produced on the collector electrode of transistor 22 by the differential amplifying action of the differential amplfier 20. In this manner, vectors appearing on the collector electrodes of transistors 21 and 22 which comprise a differential amplifier have the same absolute value but are of opposite phase. The ratio of the absolute values of these vectors is adjusted by the control voltages applied to the terminals 29 and 30 connected to the differential amplifiers 23 and 24 and the vectors are then added together by these differential amplifiers having an ability of addition. The sum vector is then added to vector $+(\dot{E}_1-\dot{E}_2)$ to form a vector $\dot{E}_3$. When the ratio between the vectors $\dot{E}_2$ and $-\dot{E}_2$ appearing on the collector electrodes of transistors 22 and 21 is selected to be P:(1 − P), vector $E_3$ can be obtained by adding these two vectors as follows.

$$\dot{E}_3 = P\dot{E}_2 + (1 - P)(-\dot{E}_2) + (\dot{E}_1 - \dot{E}_2) \quad (3)$$

where P is a real number expressed by $0 \leq P \leq 1$.

For the purpose of investigating the range of the phase angle in which the vector $\dot{E}_2$ is caused to vary by the variation in the control voltages impressed upon the terminals 29 and 30, let us consider cases wherein P = 0 and P = 1. In the case of P = 0

$$\dot{E}_3 = \dot{E}_{3(max)} = -\dot{E}_2 + (\dot{E}_1 - \dot{E}_2) = \dot{E}_1 - 2\dot{E}_2 \quad (4)$$

showing that the phase angle of the vector $E_2$ is expressed by that of the vector $\dot{E}_{3(max)}$ shown in FIG. 6. In the case of P = 1

$$\dot{E}_3 = \dot{E}_{3(min)} = \dot{E}_2 + (\dot{E}_1 - \dot{E}_2) = \dot{E}_1 \quad (5)$$

showing that the phase angle of vector $\dot{E}_2$ is expressed by that of the vector $\dot{E}_{3(min)}$ shown in FIG. 6.

Considering a case wherein the value of the control voltages impressed upon the terminals is one half of the maximum, that is P = ½, $$\dot{E}_3 = (\dot{E}_1 - \dot{E}_2) \quad (6)$$

This equation shows that the phase of vector $(\dot{E}_1 - \dot{E}_2)$ coincides with the half value of the vector $\dot{E}_{3(max)}$ because, as shown in FIG. 6, vector $(\dot{E}_1 - \dot{E}_2)$ has a phase difference of 90° with respect vectors $\dot{E}_2$ and $-\dot{E}_2$ and because $|\dot{E}_2| = |-\dot{E}_2|$.

As can be noted from equation (6) the half value of the variable phase vector $\dot{E}_3$ always coincides with the phase of vector $\dot{E}_{3(max)}$ when the value of the impressed control voltage is one half of the maximum.

In FIG. 6, where P = ½ and where $\theta$ represents the angle of phase shift, the phase $\beta$ of vector $\dot{E}_3$ is shown by $$\beta = \theta \quad (7)$$

As a consequence, even when the gain of the differential amplifier deviates from a prescribed value it is possible to coincide the half value of the voltage control range with the half value of the variable phase range of vector $\dot{E}_3$.

Where the voltage controlled type phase shifter shown in FIG. 5 is applied to a voltage controlled type oscillator, a vector whose phase angle is delayed from vector $\dot{E}_3$ by the phase shifter 38 and the tank circuit 15 is formed and this vector is used to vary the oscillation frequency of the quartz oscillator 14 to a frequency determined by the phase which is necessary to compensate for the phase difference between this vector and vector $\dot{E}_1$. The lagging phase $\theta$ acts as a filter for higher harmonics thus suppressing the same.

Figure 7:
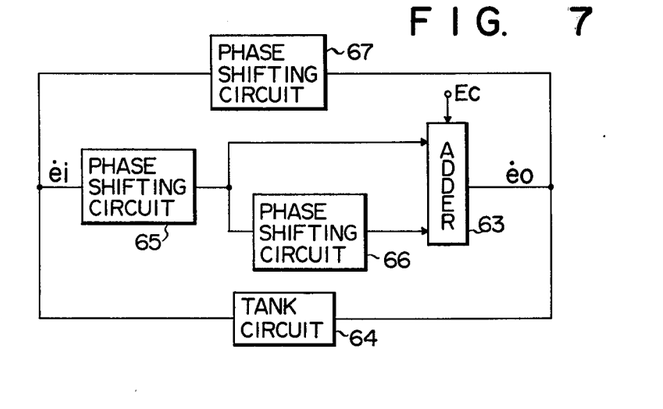
FIG. 7 is a block diagram showing one example of a voltage controlled type oscillator utilized in the VCO with phase control circuit of this invention.

FIG. 7 shows a modified voltage controlled type oscillator constituting a VCO with phase control circuit of this invention and FIG. 8 is a vector diagram showing the phase relationship of the signals at various portions of FIG. 7. A signal $\dot{e}_1$ produced by a tank circuit 64 is applied to a phase shifter 65 so that the phase $\theta_i$ of the input signal $\dot{e}_1$ applied to the phase shifter 65 is shifted by $\theta_3$ thus producing an output $\dot{e}_3$. The phase of this output $\dot{e}_3$ is shifted 180° by a phase shifter 66 to obtain a vector $\dot{e}_4$. The phase shifter 66 may comprise resistors, capacitors and inductors of a phase inverting circuit. This phase shifter may invert the phase. Voltage vectors $\dot{e}_3$ and $\dot{e}_4$ are added by an adder 63 to produce a sum output $\dot{e}_{34}$ as follows $$\dot{e}_{34} = K_1 \{\alpha \cdot \dot{e}_3 + (1 - \alpha)\dot{e}_4\} \tag{8}$$

where $K_1$ is the maximum transmission coefficient of the adder 63.

The output signal $\dot{e}_1$ is amplified by the phase shifter 67 to produce a vector $\dot{e}_5$ having the same phase as the input signal $\dot{e}_1$. The input to the tank circuit 64 is the vector sum $\dot{e}_0$ of the vectors $\dot{e}_{34}$ and $\dot{e}_5$ which is positively fed back to phase shifter 65 through the tank circuit 64. Signal $\dot{e}_0$ is expressed by the following equation $$\dot{e}_0 = \dot{e}_{34} + \dot{e}_5.$$

By using an oscillation frequency produced by the tank circuit as a reference frequency when control voltage $E_0$ (that controls the relative ratio of the absolute values of the voltage vectors $\dot{e}_3$ and $\dot{e}_4$) applied to the adder is at the center of the range, the vector $\dot{e}_{34}$ can be expressed as follows $$\dot{e}_{34} = K_1/2 \, (K_3\dot{e}_3 + K_4\dot{e}_4) \tag{10}$$

As above described since vectors $\dot{e}_3$ and $\dot{e}_4$ have opposite phases when $\dot{e}_3 = +\dot{e}_4$ and $K_3 = K_4$, from equation (10) $\dot{e}_{34} = 0$. Thus, the reference frequency is determined by vector $\dot{e}_5$ having the same phase as the input signal $\dot{e}_1$ and not influenced by the phase shifters 65 and 66, showing that variation in the phase angle shifted by the phase shifters 65 and 66 does not cause any variation in the reference frequency. Consequently, it is possible to obtain extremely stabilized oscillation frequencies. This enables nonadjustment of the oscillation frequency. Even when an adjustment is necessary, its range may be narrow because variation in the phase shift is prevented.

Figure 9:
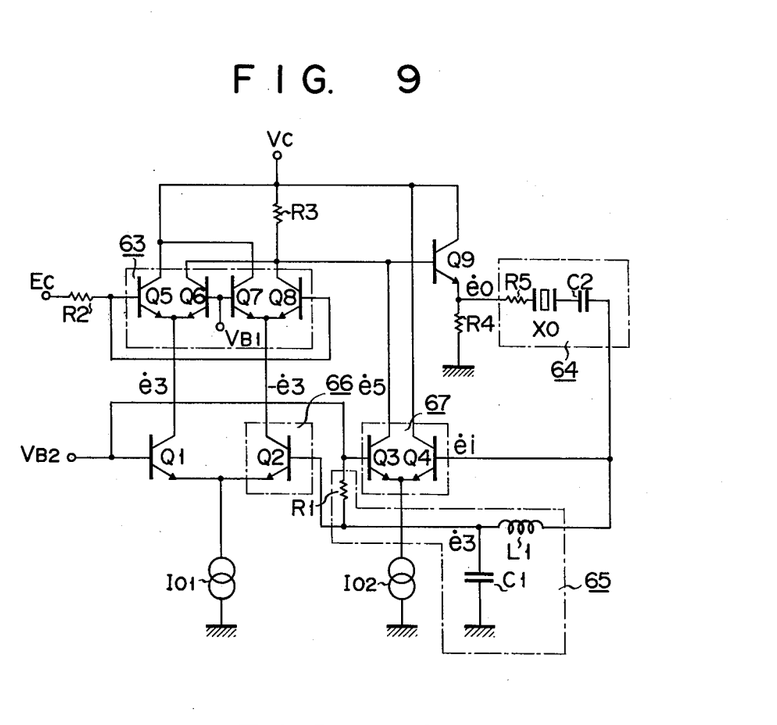
FIG. 9 is a connection diagram showing the detail of the block diagram shown in FIG. 7.
Figure 10:
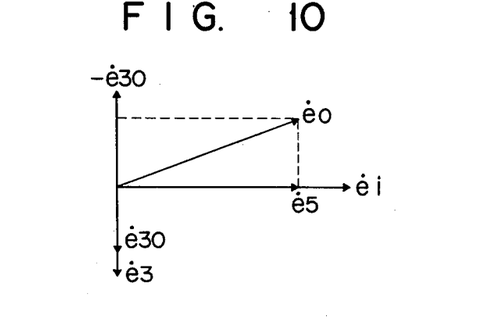
FIG. 10 is a vector diagram useful to explain the operation of the circuit shown in FIG. 9.

FIG. 9 shows the detail of the construction of the block diagram shown in FIG. 7, and FIG. 10 is a vector diagram showing the phase relationship of the signals at various portions of FIG. 9. In FIG. 9, a phase shifter constituted by an inductor $L_1$, a capacitor $C_1$ and a resistor $R_1$ corresponds to the phase shifter 65 shown in FIG. 7; a quartz vibrator $X_0$ and a capacitor $C_2$ correspond to the tank circuit 64 and a differential amplifier made up of transistors $Q_3$ and $Q_4$ corresponds to phase shifter 67. Transistor $Q_2$ of a differential amplifier made up of a pair of transistors $Q_1$ and $Q_2$ corresponds to the phase shifter 66 shown in FIG. 7. In this case, the phase shifter 66 acts as a phase inverter. Two differential amplifiers constituted by transistors $Q_5$, $Q_6$ and transistors $Q_7$ and $Q_8$ respectively are combined to form a doubly balanced type differential amplifier which corresponds to adder 63 shown in FIG. 7. By denoting the base input to transistor $Q_4$ by $\dot{e}_1$ the phase angle of vector $\dot{e}_1$ is delayed by inductor $L_1$, capacitor $C_1$ and resistor $R_1$ to obtain a delayed vector $\dot{e}_3$. Vector $\dot{e}_1$ is applied to the collector electrode of transistor $Q_3$ via transistors $Q_4$ and $Q_3$ as a vector $\dot{e}_5$ having the same phase as vector $\dot{e}_1$. The voltage vector $\dot{e}_3$ produces vectors $\dot{e}_3$ and $-\dot{e}_3$ on the collector electrodes of transistors $Q_1$ and $Q_2$. Denoting these vectors by $\dot{e}_{30}$ and $-\dot{e}_{30}$ respectively, the amplitudes thereof are controlled by transistors $Q_6$ and $Q_8$ respectively and then applied to the base electrodes of transistors $Q_6$ and $Q_8$ with their collector electrodes commonly connected, whereby the voltage vectors are added to each other for producing vector $\dot{e}_{34}$ expressed by equation (8). At the same time, these voltage vectors are combined with vector $\dot{e}_5$ appearing on the collector electrode of transistor $Q_3$ for producing a vector $e_0$ expressed by equation 9 and appearing on the emitter electrode of transistor $Q_9$ connected to act as an emitter follower. The voltage vector $\dot{e}_0$ is applied to tank circuit 64.

Where the control voltage $E_c$ is equal to $E_0$ (the voltage at the center of the range of the control voltage), or $E_c = V_{B1}$ in the case of FIG. 9, where $V_{B1}$, represents the base bias voltage of transistors $Q_6$ and $Q_7$, $\alpha$ in equation (8) becomes $\frac{1}{2}$ so that vectors $\dot{e}_{30}$ and $-\dot{e}_{30}$ cancel each other and the output voltage vector $\dot{e}_0 = \dot{e}_5$. In this manner, the output vector $\dot{e}_0$ will have the same phase as the input signal $\dot{e}_1$ without being affected by the amount of phase shift provided by the phase shifter 65. For this reason, the variation in the frequency caused by the deviations in the values of elements $L_1$, $C_1$ and $R_1$ that constitute the phase shifter 65 is extremely small. When the control voltage $E_c$ at the center of the control range the only loop utilized is the loop including the differential amplifier constituted by transistors $Q_3$ and $Q_4$ so that the phase of a path from the base input to the transistor $Q_4$ and to the emitter output of transistor $Q_9$ does not deviate from a prescribed value.

Figure 11:
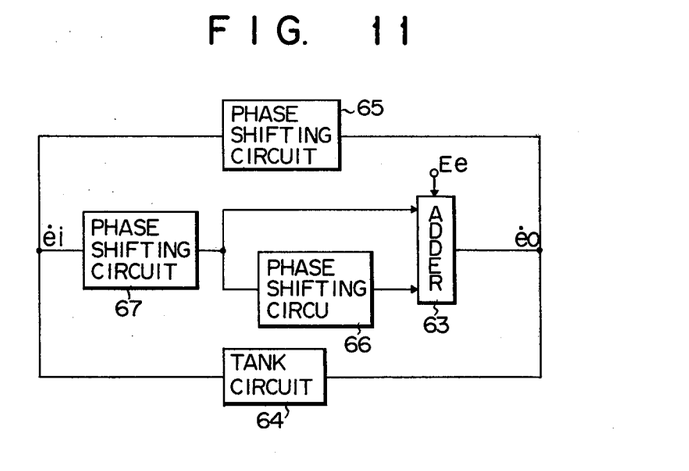
FIG. 11 is a block diagram showing another example of the voltage controlled type oscillator.
Figure 12:
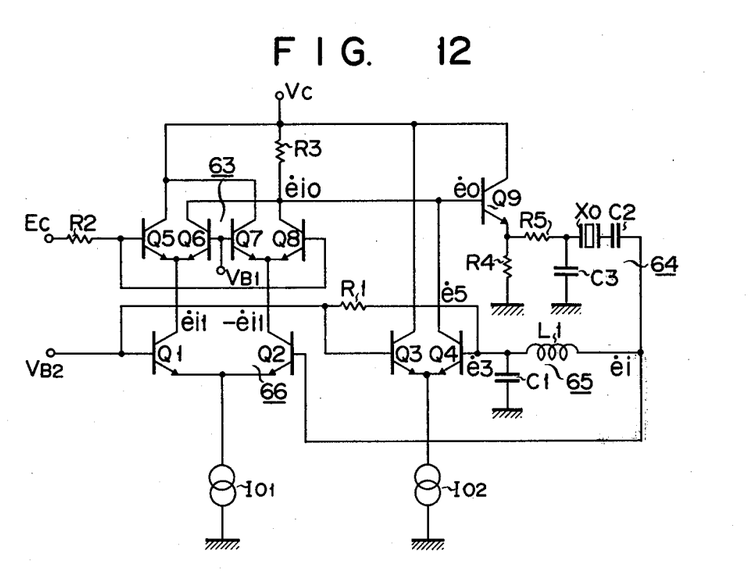
FIG. 12 is a connection diagram showing the detail of the block diagram shown in FIG. 11.

Another form of the voltage controlled type oscillator is illustrated in FIG. 11, the detail thereof bring shown in FIG. 12. The circuit shown in FIG. 11 is similar to that shown in FIG. 7 except that the phase shifter 67 is replaced by a phase shifter 65 which is constructed to lag the phase by 90° and that a capacitor $C_3$ is added between the junction between resistor $R_5$ and the quartz vibrator $X_0$ of the tank circuit 64 and the ground. In this case too, when the control voltage $E_c = E_0$ ($E_0$ is a voltage at the center of the control voltage), the oscillation frequency is determined by the output voltage $\dot{e}_5$ of the phase shifter 65 connected between the input and output so that when the constants of the phase shifter 65 deviate the oscillation frequency will vary.

According to this embodiment, however, by designing the phase shifter 65 to provide a 90° phase lag, not only the phase shifting operation of the phase shifter 65 and hence the oscillation frequency can be stabilized but also higher harmonics can also be suppressed. As shown in FIG. 12, the phase shifter 65 is constituted by an inductor $L_1$, a capacitor $C_1$ and a resistor $R_1$. Denoting the input to transistor $Q_2$ by $\dot{e}_1$ (phase 0°) the phase relationship between this input and the input $\dot{e}_3$ to transistor $Q_4$ is expressed by the following equation $$\dot{e}_1/\dot{e}_3 = (1 - \omega^2 L_1 C_1) + j\omega (L_1/R_1) \tag{11}$$

Where the values of inductor $L_1$ and capacitor $C_1$ are selected to satisfy a relation $1 = \omega^2 L_1 C_1$, then we obtain the following relation $$1 - \omega^2 L_1 C_1 << 1 \, (L_1/R_1) \tag{12}$$

Thus $$(\dot{e}_1/\dot{e}_3) = j\omega \, (L_1/R_1) \tag{13}$$

Even when the values of the inductance and capacitance of the elements $L_1$ and $C_1$ deviate more or less, equation (12) holds so that it is possible to maintain the phase $\theta_3$ of vector $\dot{e}_3$ at $-90°$ irrespective of the deviation in the values of the elements $L_1$ and $R_1$. In other words, with this phase shifter it is possible to prevent variation in the set value of the phase delay. The output $\dot{e}_3$ of the phase shifter 65 is amplified by a differential amplifier constituted by transistors $Q_3$ and $Q_4$ thus producing an inverted voltage vector $\dot{e}_5$ (having a phase difference of 90° with respect to vector $\dot{e}_1$). The vector $\dot{e}_1$ is amplified by a differential amplifier constituted by transistors $Q_1$ and $Q_2$ thus producing vectors $\dot{e}_{11}$ and $-\dot{e}_{11}$ on the collector electrodes of transistors $Q_1$ and $Q_2$ respectively. The relative amplitude of vectors $\dot{e}_{11}$ and $-\dot{e}_{11}$ is controlled by the control voltage $E_c$ applied to a doubly balanced type differential amplifier constituted by transistors $Q_5$, $Q_6$, $Q_7$ and $Q_8$ and then the vectors $\dot{e}_{11}$ and $-\dot{e}_{11}$ are added to each other on the collector outputs of the transistors $Q_6$ and $Q_8$ thus producing a sum vector $\dot{e}_{10}$. Further, this vector $\dot{e}_{10}$ is added to vector $\dot{e}_5$ to produce an output vector $\dot{e}_0$ on the emitter electrode of transistor $Q_9$. As a consequence, when the control voltage $E_c$ is at the center of the control range, that is when $E_c = E_0$, $\dot{e}_{10} = 0$. Consequently, the signal representing the reference signal is determined by vector $\dot{e}_5$ which is an inversion of the output $\dot{e}_3$ from the phase shifter 65 which is free from any variation in the phase delay caused by the variation in the values of the elements that constitute the phase shifter. In other words, the reference frequency does not vary. Further, the phase angle of vector $\dot{e}_0$ is advanced 90° with respect to vector $\dot{e}_1$, and the output $\dot{e}_0$ is fed back to the oscillator through a tank circuit, including resistor $R_5$ capacitors $C_3$ and $C_2$ and quartz vibrator $X_0$ (in this case, the tank circuit includes the phase shifter) such that $\dot{e}_0$ and $\dot{e}_1$ will have the same phase but as the resistor $R_5$ and capacitor $C_3$ constitute a lowpass filter, the high harmonic gain of the oscillation loop becomes smaller than the loop gain for the fundamental frequency, thereby efficiently suppressing higher harmonics.

Figures 13, 14:
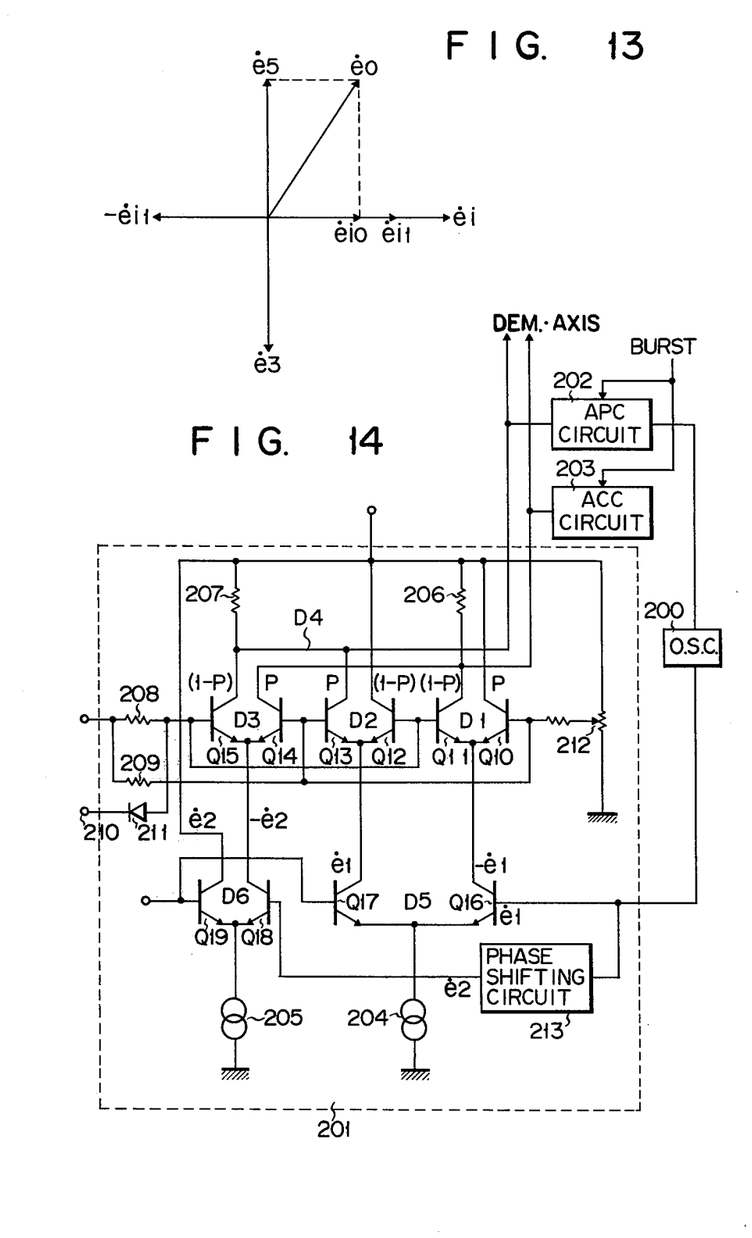
FIG. 13 is a vector diagram helpful to explain the operation of the circuit shown in FIG. 12.
FIG. 14 is a connection diagram showing another embodiment of the VCO with phase control circuit.

FIG. 14 shows another example of the VCO with phase control circuit of this invention, which comprises an oscillator 200 for producing a subcarrier wave, a hue control circuit 201 connected to the oscillator 200 for producing subcarrier wave signals having a phase difference of 90° necessary to adjust the hue, R-Y axis and B-Y axis, an APC circuit 202 connected to the oscillator 200 through the hue control circit 201 for forming a closed loop so as to stabilize the subcarrier wave by phase control, and an ACC circuit 203 connected to the output of the hue control circuit 201 for controlling the gain of the band amplification of the carrier color signal and for controlling the color killer, by detecting the phase.

The hue control circuit 201 comprises a balanced type differential amplifier $D_4$ constituted by a differential amplifier $D_1$ including transistors $Q_{10}$ and $Q_{11}$, a differential amplifier $D_2$ including transistor $Q_{12}$ and $Q_{13}$, and a differential amplifier $D_3$ including transistors $Q_{14}$ and $Q_{15}$, a differential amplifier $D_5$ including transistors $Q_{16}$ and $Q_{17}$ and provided with a constant current source 204, a differential amplifier $D_6$ including transistors $Q_{18}$ and $Q_{19}$ and provided with a constant current source 205, a resistor 206 for deriving out the output from the differential amplifier $D_1$ and $D_3$ a resistor 207 for deriving out the output from the differential amplifiers $D_1$ and $D_3$, bias resistors 208 and 209, a diode 211 with its anode electrode connected to one end of the bias resistor 208 and the cathode electrode connected to a terminal 210 for receiving a burst gate pulse, a variable resistor 212 for controlling the bias voltage of the balanced differential amplifier $D_4$, and a 90° phase shifter 213 connected across the base electrodes of transistors $Q_{16}$ and $Q_{18}$.

The phase control circuit shown in FIG. 14 operates as follows.

At first, the scanning interval in which no burst gate pulse is applied to the terminal 210 that is when the transistor $Q_{15}$ is normally biased will be described. Signal $\dot{e}_1$ synchronous with the burst signal generated by the oscillator 200 is applied to the base electrode of transistor $Q_{16}$ and the phase of signal $\dot{e}_1$ is shifted 90° by the phase shifter 213 for producing a signal $\dot{e}_2$ which is applied to the base electrode of transistor $Q_{18}$. Accordingly a signal $-\dot{e}_1$, an inversion of $\dot{e}_1$, appears on the collector electrode of transistor $Q_{16}$ and signal $\dot{e}_1$ appears on the collector electrode of transistor $Q_{17}$ which is paired with transistor $Q_{16}$. In the same manner, $-\dot{e}_2$ appears on the collector electrode of transistor $Q_{18}$ supplied with signal $\dot{e}_2$ having a 90° phase difference with respect to $\dot{e}_1$ thus producing a signal $\dot{e}_2$ on the collector electrode of transistor $Q_{19}$. The ratio of the absolute values of the collector voltages $-\dot{e}_1$, $\dot{e}_1$ and $-\dot{e}_2$ of the transistors $Q_{16}$, $Q_{17}$ and $Q_{18}$ respectively is adjusted to a prescribed ratio by a balanced type differential amplifier $D_4$ constituted by differential amplifiers $D_1$, $D_2$ and $D_3$ and these collector voltages are then added vectorially by variable resistor 212.

Suppose now that the ratio of the transistors $Q_{10}$ and $Q_{11}$ of the differential amplifier $D_1$ is P:(1−P), the proportional signal distribution coefficient of a transistor of the balanced differential amplifier $D_4$ having its base electrode connected to the base electrode of transistor $Q_{10}$ is P and that of the transistor having its base electrode connected to the base electrode of transistor $Q_{11}$ is (1 − P). Thus, in the differential amplifier $D_2$, the ratio of the signals flowing through transistors $Q_{12}$ and $Q_{13}$ is (1 − P):P whereas in the differential amplifier $D_3$, the ratio of the signals flowing through transistors $Q_{14}$ and $Q_{15}$ is P:(1 − P), where P is expressed by a relation $$0 \leq P \leq 1$$

The manner of compounding vectors by a balanced type differential amplifier will be described with reference to the vector diagram shown in FIG. 15.

At the resistor 206 connected to the collector electrode of transistor $Q_{11}$ comprising the differential amplifier $D_1$, the collector voltage $-(1 - P)\dot{e}_1$ of transistor $Q_{11}$ and the collector voltage $-P\dot{e}_2$ of the transistor $Q_{14}$ are added vectorially to obtain a sum voltage $\dot{e}_{(R-Y)}$ $$\dot{e}_{(R-Y)} = -(1 - P)\dot{e}_1 - P\dot{e}_2 \tag{13}$$

At the resistor 207, the collector voltage $-(1 - P)\dot{e}_2$ of transistor $Q_{15}$ and the collector voltage $P\dot{e}_1$ of transistor $Q_{13}$ are added vectorially, thus $$\dot{e}_{(B-Y)} = P\dot{e}_1 - (1 - P)\dot{e}_2 \tag{14}$$

Figure 15:
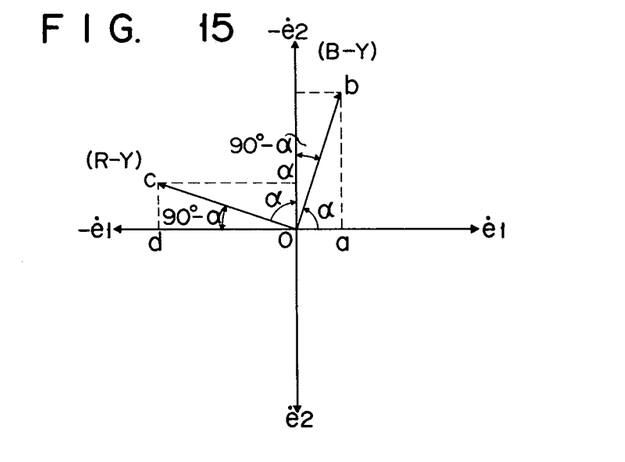
FIG. 15 is a vector diagram useful to explain the operation of the circuit shown in FIG. 14.

The results of additions expressed by equations 13 and 14 have a positional relationship as shown in FIG. 15.

Denoting the angle between vectors $\dot{e}_1$ and $\dot{e}_{(B-Y)}$ by $\alpha$, triangles aob and cod are identical so that vector $\dot{e}_{(R-Y)}$ is perpendicular to vector $\dot{e}_{(B-Y)}$.

Two vectors $\dot{e}_{(B-Y)}$ and $\dot{e}_{(R-Y)}$ which are phase shifted by $\alpha$ by controlling the bias voltage of transistors $Q_{10}$, $Q_{13}$ and $Q_{14}$ by variable resistor 212 with respect to the output from th oscillator 200, thus having a phase difference of 90° are used as the subcarrier waves for effecting two axis demodulation. At this time, since the burst gate pulse is not present at terminal 210, the APC circuit 202 does not operate.

When a negative burst gate pulse reaches terminal 210 a diode 211 becomes conductive thus turning OFF transistors $Q_{15}$, $Q_{12}$ and $Q_{11}$ and the value of P shown by equations 13 and 14 becomes 1 and signal $\dot{e}_1$ synchronous with the burst signal and 90° phase shifted, and signal $-\dot{e}_2$ appear across resistor 206 and 207 respectively. The outputs from the hue control circuit 201 having a phase difference of 90° (which are produced when the burst gate signals are received) are used as the phase detection signal for the APC circuit 202 (which responds to the burst gate pulse to stabilize the oscillation frequency of the oscillator 200 by phase control) and for the ACC circuit 203 (which controls automatically the gain of the band amplification of the carrier color signal by the burst signal injected by the burst gate pulse).

With this construction the required phase shifting is accomplished by only one phase shifter 213 which provides a 90° phase shift whereby the number of the phase shifters is decreased thus making easy to incorporate it into an integrated circuit.

Denoting the phase difference between the signal of the hue control circuit 201 and the burst signal at the time of receiving the same by $\theta_0$, and by denoting the amount of phase shift by the hue control circuit 201 which depends upon a variable P by $\theta(P)$, the angle $\theta_{burst}$ between the burst signal and one of the axes utilized for the two axis demodulation is expressed by the following equation $$\theta_{burst} = \theta_0 + \theta(P) \tag{15}$$

In some cases $\theta_0$ fluctuates due to the circuit condition of the burst gate pulse circuit, but in this invention $\theta_0$ is maintained at a constant value by making P = 1.

Figure 16:
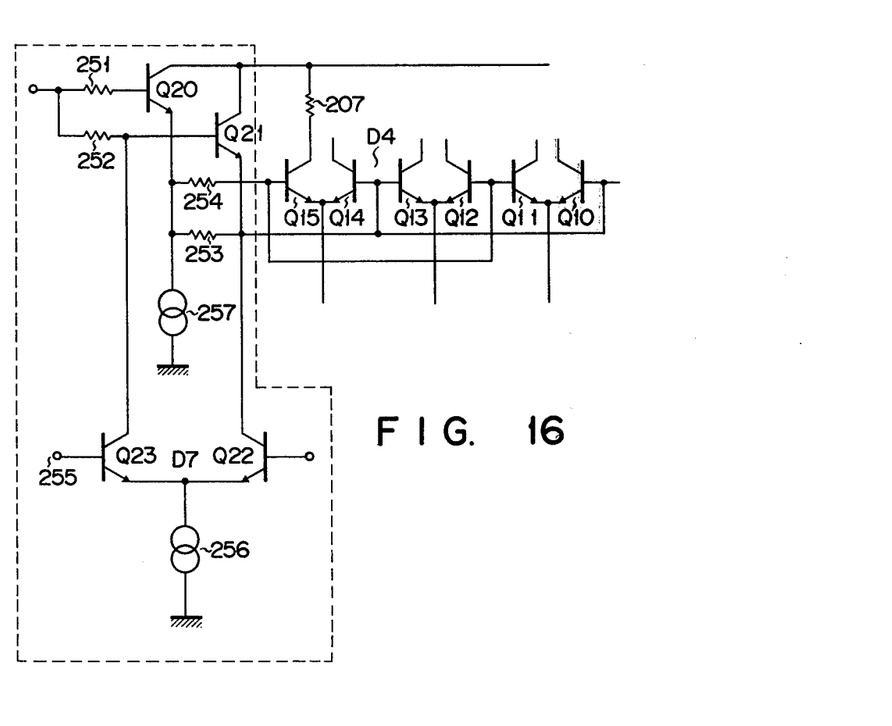
FIG. 16 is a connection diagram showing a modification of the VCO with phase control circuit shown in FIG. 14.

A circuit for maintaining P at a constant value during the burst signal interval is shown in FIG. 16, in which circuit elements identical to those shown in FIG. 14 are not shown.

Thus, the circuit for maintaining the value of the variable P at a constant value during the burst signal interval comprises transistors $Q_{20}$ and $Q_{21}$ with their base electrodes connected to bias resistor 251 and 252 respectively, a resistor 253 connected between the emitter electrodes of these transistors, a resistor 254 connected between the emitter electrode of transistor $Q_{20}$ and the base electrode of transistor $Q_{15}$ which constitutes a balanced type differential amplifier, a transistor $Q_{22}$ with its collector electrode connected to the emitter electrode of transistor $Q_{21}$, a differential amplifier $D_7$ including a transistor $Q_{23}$ with its collector electrode connected to resistor 252 and the base electrode connected to a burst gate pulse receiving terminal 255, a constant current source 256 connected between the commonly connected emitter electrodes of transistors $Q_{22}$ and $Q_{23}$ that constitute the differential amplifier and the ground, and a constant current source 257 connected between the emitter electrode of transistor $Q_{20}$ and the ground.

Where a negative burst gate pulse is not applied to terminal 255, transistor $Q_{23}$ is conductive whereas transistors $Q_{21}$ and $Q_{22}$ are not conductive so that a bias voltage suitable for adjusting the hue is applied to the base electrode of transistor $Q_{15}$ which constitute the balanced type differential amplifier through resistor 254 and transistor $Q_{20}$ which is now conductive.

When a burst gate pulse is applied to terminal 255, transistor $Q_{23}$ is turned OFF, whereas transistors $Q_{20}$, $Q_{21}$ and $Q_{22}$ are turned ON. Since the current values of the constant current sources 256 and 257 are selected such that the base potential of transistor $Q_{15}$ that constitutes the balanced type differential amplifier $D_4$ and connected to resistor 254 will be equal to the collector potential of transistor $Q_{22}$ the value of P is maintained at a constant value of $\frac{1}{2}$.

What is claimed is:

1. A voltage controlled oscillator comprising:
   a differential amplifier having a pair of input terminals and an output terminal;
   a resonant circuit connected in a closed loop between one of said input terminals and the output terminal of said differential amplifier, to supply a reference signal of predetermined frequency to said one input terminal of said differential amplifier;
   phase-shifting means, connected between said respective differential amplifier input terminals for generating a phase shifted reference signal phase shifted from said reference signal by a predetermined amount for application to the other input terminal of said differential amplifier;
   anti-phase signal generating means, responsive to said phase shifted reference signal, for generating an anti-phase signal 180° out of phase with said phase shifted reference signal;
   control-addition means, responsive to signals indicative of said phase shifted reference and anti-phase signals and a magnitude control signal applied thereto, for controlling the magnitudes of said phase shifted reference and anti-phase signals in accordance with said magnitude control signal and for generating a signal indicative of the vector sum of said phase shifted and anti-phase signals; and
   means for generating a signal indicative of the sum of said control-addition means output signal and said differential amplifier output signal and for generating therefrom a positive feedback signal in said closed loop.

2. A voltage controlled oscillator with phase control circuits for generating signals indicative of demodulation axes for hue-signals in a color television receiver comprising:
- a first differential amplifier having a pair of input terminals and output terminals;
- a resonant circuit connected in a closed loop between one of said input terminals and one output terminal of said differential amplifier to supply a reference signal of predetermined frequency to said one input terminal;
- phase-shifting means, connected between the respective input terminals of said differential amplifier, for generating a phase shifted reference signal phase shifted from said reference signal by a predetermined amount, for application to the other input terminal of said differential amplifier;
- anti-phase signal generating means responsive to said phase shifted reference signal for generating an anti-phase signal 180° out of phase with said phase shifted reference signal;
- control-addition means, responsive to signals indicative of said phase shifted reference and anti-phase signals and a magnitude control signal applied thereto for controlling the magnitudes of both said phase shifted reference and said anti-phase signals and for generating a signal indicative of the vector sum of said phase shifted and anti-phase signals;
- first synthesizing means for combining the output signal of said control-addition means and one output signal of said first differential amplifier and for generating therefrom a positive feedback signal in said closed loop;
- second synthesizing means for combining another output signal of said first differential amplifier and a signal indicative of one of said phase shifted reference and anti-phase signals; and
- third synthesizing means for combining said another output signal of said first differential amplifier and the other of said phase shifted reference and anti-phase signals;
- the respective output signals of said second and third synthesizing means being indicative of said demodulation axes.

3. The oscillator of claim 2 wherein said first differential amplifier comprises first and second transistors respectively associated with said one input terminal and said other input terminal of said amplifier, the output terminal of said first transistor being connected to said second and third synthesizing means and the output terminal of said second transistor connected to said first synthesizing means.

4. A voltage controlled oscillator with phase control circuits, comprising:
- a differential amplifier having a pair of input terminals and an output terminal;
- a resonance circuit connected in a closed loop between one of said input terminals and the output of said differential amplifier to supply a reference signal to said one input terminal of said differential amplifier, said resonance circuit generating an oscillation output with a predetermined frequency;
- phase-shifting means connected between said input terminals of said differential amplifier to phase shift a reference signal of said resonance circuit a predetermined amount, and apply said phase shifted signal to the other of the input terminals of said differential amplifier;
- anti-phase signal generating means for generating a signal corresponding to said phase shifted reference signal and a signal 180° out of phase with said phase-shifted reference signal;
- control-addition means for controlling the magnitudes of both the signals of said anti-phase signal generating means by a predetermined control voltage and for adding these signals; and
- means for combining the output of said control-addition means and the output of said differential amplifier and for generating therefrom a positive feedback signal in said closed loop.

5. A voltage controlled oscillator with phase control circuits comprising:
- a first differential amplifier having a pair of input terminals and output terminals;
- a resonance circuit connected in a closed loop between one of said input terminals and one of said output terminals of said first differential amplifier and adapted to supply a reference signal to said one input terminal of said first differential amplifier, said resonance circuit generating an oscillation output with a predetermined frequency;
- phase-shifting means connected between said input terminals of said first differential amplifier and adapted to phase shift the reference signal of said resonance circuit a predetermined amount and apply said phase shifted signal to the other of the input terminals of said differential amplifier;
- anti-phase signal generating means for generating a signal corresponding to said phase-shifted reference signal and a signal 180° out of phase with said phase-shifted reference signal;
- control-addition means for controlling the magnitudes of both the signals of said anti-phase signal generating means by a predetermined control voltage and for adding these signals;
- first synthesizing means for combining the output of said control-addition means and one output of said first differential amplifier
- and for generating therefrom a positive feedback signal in said closed loop;
- second synthesizing means for combining another output of said first differential amplifier and one of said two signals of said anti-phase signal generating means; and
- third synthesizing means for combining said another output of said first differential amplifier and the other one of said two signals of said anti-phase signal generating means, in which the output signal of said second synthesizing means and the output signal of said third synthesizing means are utilized each as a demodulation axis for hue-signals.

6. A voltage controlled oscillator with phase control circuits as claimed in claim 5, in which said one output of said first differential amplifier is a difference vector signal between said reference signal and said phase-shifted signal and is used as a constant vector signal and in which said constant vector signal and the output signal of said control-addition means are vectorially combined, to generate therefrom said positive feedback signal in said closed loop.

7. A voltage controlled oscillator with phase control circuits in accordance with claim 5 in which said first differential amplifier comprises a first transistor having said one input terminal of said amplifier and a second transistor having the other input terminal of said amplifier, the output of said first transistor being connected to said second and third synthesizing means and said second transistor being connected to said first synthesizing means.

8. A voltage controlled oscillator with phase control circuits as claimed in claim 5, in which a circuit arrangement of said second and third synthesizing means includes a second differential amplifier generating signals indicative of said signals of said anti-phase signal generating means; comprising one transistor supplied with a signal obtained by phase-shifting said reference signal by said phase shifting means and another transistor which together with said one transistor constitutes a pair.

9. A voltage controlled oscillator with phase control circuits, comprising a differential amplifier having a pair of input terminals and output terminals, a resonance circuit connected in a closed loop between one of said input terminals and one of said output terminals of said differential amplifier and adapted to supply a reference signal to said one input terminal of said differential amplifier, said resonance circuit generating an oscillation output with a predetermined frequency;
phase-shifting means connected between both the input terminals of said differential amplifier and adapted to phase shift a reference signal of said resonance circuit a predetermined amount and apply the phase-shifted signal to the other input of said differential amplifier;
anti-phase signal generating means for generating a signal corresponding to said phase-shifted reference signal and a signal 180° out of phase with said phase shifted signal; and
control-addition means for controlling the magnitudes of both the signals of said anti-phase signal generating means in accordance with a constant control voltage and for adding these signals, and means for combining the output of said control-addition means and one output of said differential amplifier and for generating therefrom a positive feedback signal in said closed loop.

10. A voltage controlled oscillator with phase control circuits as claimed in claim 9 further including a first synthesizing means for combining another output of said differential amplifier and a signal corresponding to one of the respective signals of said anti-phase signal generating means and second synthesizing means for combining said another output of said differential amplifier and the other one of said signals of said anti-phase signal generating means, and in which the output signal of said first synthesizing means and the output signal of said second synthesizing means are each utilized as a demodulation axis.

11. A voltage controlled oscillator with phase control circuits as claimed in claim 10, in which the reference signal of said resonance circuit is voltage-divided at a predetermined ratio to supply it to said one input terminal of said differential amplifier.

* * * * *